United States Patent
Nagaoka et al.

(10) Patent No.: US 7,481,240 B2
(45) Date of Patent: Jan. 27, 2009

(54) PARTIAL PRESSURE CONTROL SYSTEM, FLOW RATE CONTROL SYSTEM AND SHOWER PLATE USED FOR PARTIAL PRESSURE CONTROL SYSTEM

(75) Inventors: Hideki Nagaoka, Yamanashi (JP); Hiroshi Koizumi, Yamanashi (JP); Jun Ooyabu, Yamanashi (JP); Tsuyoshi Shimazu, Yamanashi (JP); Hiroki Endo, Yamanashi (JP); Keiki Ito, Yamanashi (JP); Daisuke Hayashi, Yamanashi (JP)

(73) Assignee: Tokyo Electron Limited (JP)

( * ) Notice: Subject to any disclaimer, the term of this patent is extended or adjusted under 35 U.S.C. 154(b) by 646 days.

(21) Appl. No.: 10/863,205

(22) Filed: Jun. 9, 2004

(65) Prior Publication Data

US 2005/0029369 A1 Feb. 10, 2005

(30) Foreign Application Priority Data

Jun. 9, 2003 (JP) ............................. 2003-163696

(51) Int. Cl.
*G05D 11/13* (2006.01)
*G05D 16/20* (2006.01)
(52) U.S. Cl. ...................... 137/486; 137/487.5; 118/715
(58) Field of Classification Search .............. 137/487.5, 137/486, 14, 9; 118/715; 438/935; 73/1.62; 702/98, 87
See application file for complete search history.

(56) References Cited

U.S. PATENT DOCUMENTS

| | | | | | |
|---|---|---|---|---|---|
| 5,453,124 | A | * | 9/1995 | Moslehi et al. | 118/715 |
| 6,090,210 | A | * | 7/2000 | Ballance et al. | 118/725 |
| 6,138,708 | A | * | 10/2000 | Waldbusser | 137/341 |
| 6,237,394 | B1 | * | 5/2001 | Harris et al. | 73/1.88 |
| 6,333,272 | B1 | | 12/2001 | McMillin et al. | |
| 6,631,334 | B2 | * | 10/2003 | Grosshart | 702/50 |
| 6,752,166 | B2 | * | 6/2004 | Lull et al. | 137/9 |
| 6,820,632 | B2 | * | 11/2004 | Ohmi et al. | 137/14 |
| 6,986,359 | B2 | * | 1/2006 | Shajii et al. | 137/14 |
| 2002/0038669 | A1 | * | 4/2002 | Yamagishi et al. | 137/118.04 |
| 2003/0003696 | A1 | * | 1/2003 | Gelatos et al. | 438/485 |

FOREIGN PATENT DOCUMENTS

| | | |
|---|---|---|
| JP | 05-315290 | 11/1993 |
| JP | 2001-017852 | 1/2001 |

\* cited by examiner

*Primary Examiner*—Kevin L Lee
(74) *Attorney, Agent, or Firm*—Finnegan, Henderson, Farabow, Garrett & Dunner L.L.P.

(57) ABSTRACT

A partial pressure control system 45 includes two valves 2 which are branched from an operation gas supply pipe 44 and which variably control operation gas, pressure sensors 3 which are respectively connected to the each valves 2 in series and which detect pressure of the operation gas, and a controller 25 which proportionally controls the operation of the valves 2 based on detection result of the pressure sensors 3, thereby relatively controlling pressures P1 and P2 of the two valves. With this configuration, it is possible to reduce wastefull consumption of the operation gas, and to enhance the responsivity with respect to change of setting and the like.

7 Claims, 7 Drawing Sheets

PARTIAL PRESSURE CONTROL SYSTEM, FLOW RATE CONTROL SYSTEM AND SHOWER PLATE USED FOR PARTIAL PRESSURE CONTROL SYSTEM

BACKGROUND OF THE INVENTION

The present invention relates to a partial pressure control system, a flow rate control system, which outputs operation gas at a predetermined partial pressure ratio, and a shower plate used for the partial pressure control system.

DESCRIPTION OF THE RELATED ART

Figure 6:
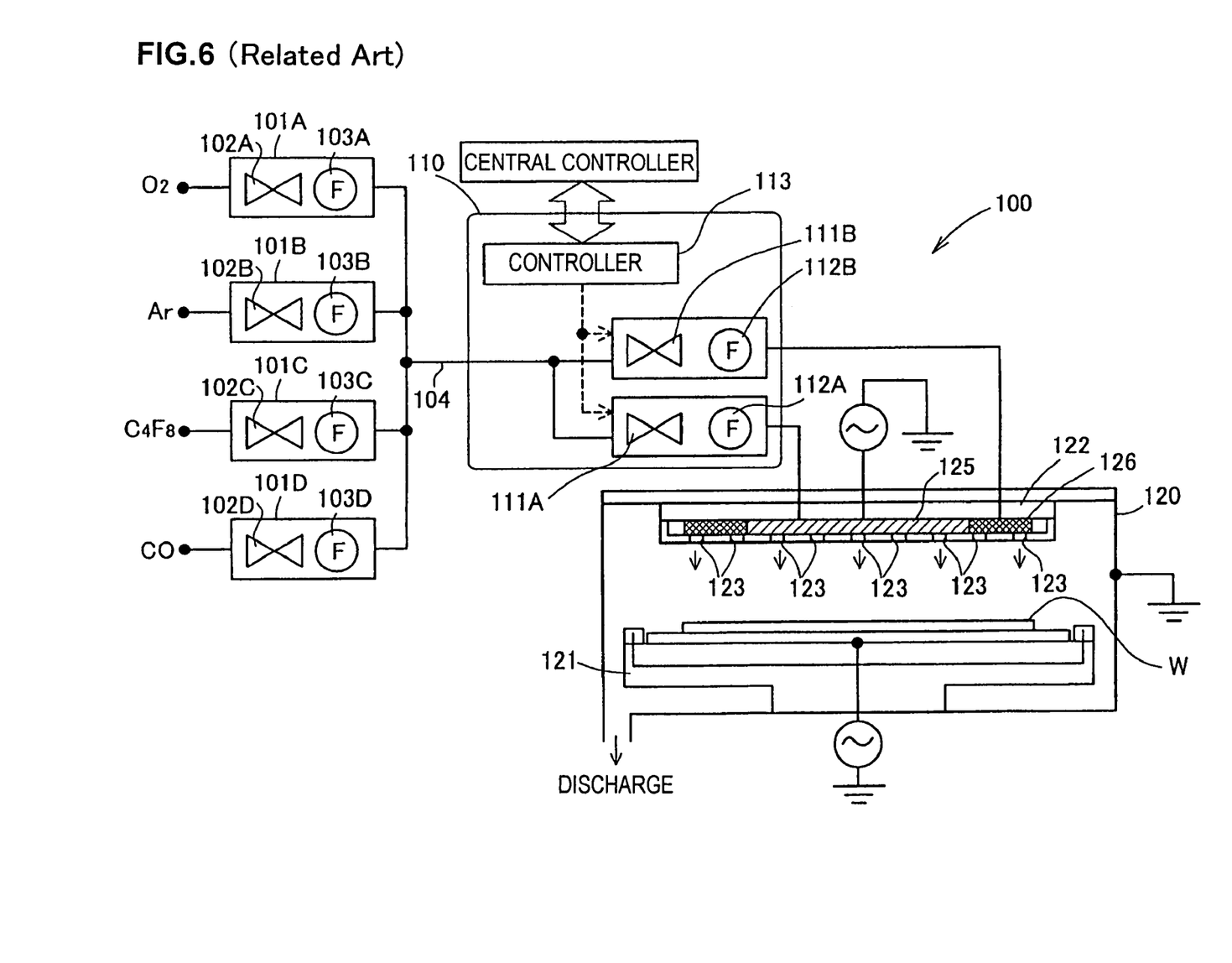
FIG. 6 is a schematic block diagram of a conventional flow rate control system.
Figure 7:
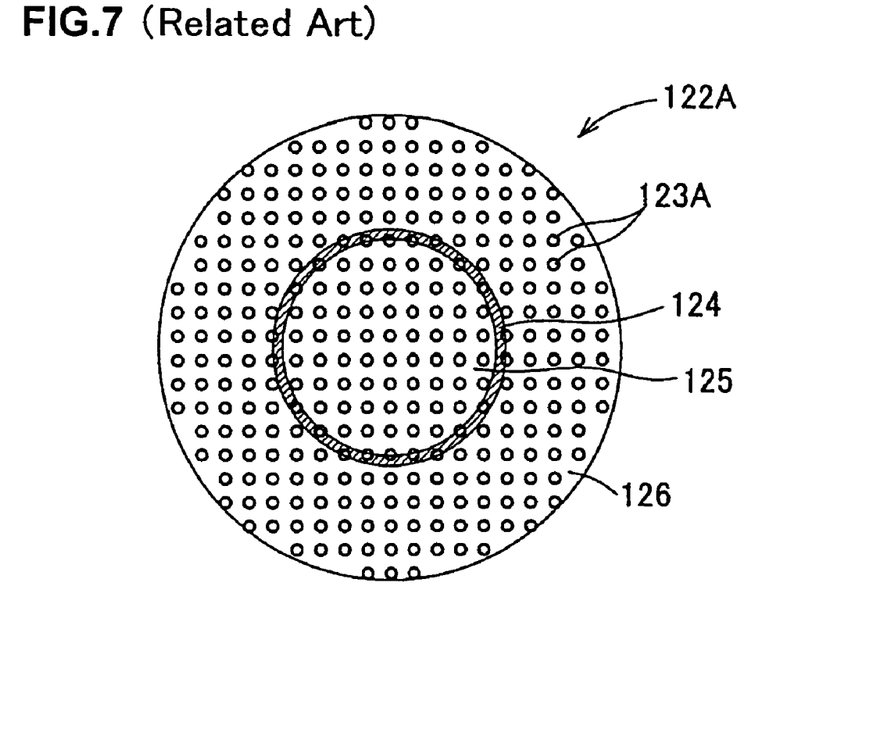
FIG. 7 is a plan view of a conventional shower plate.
Figure 8:
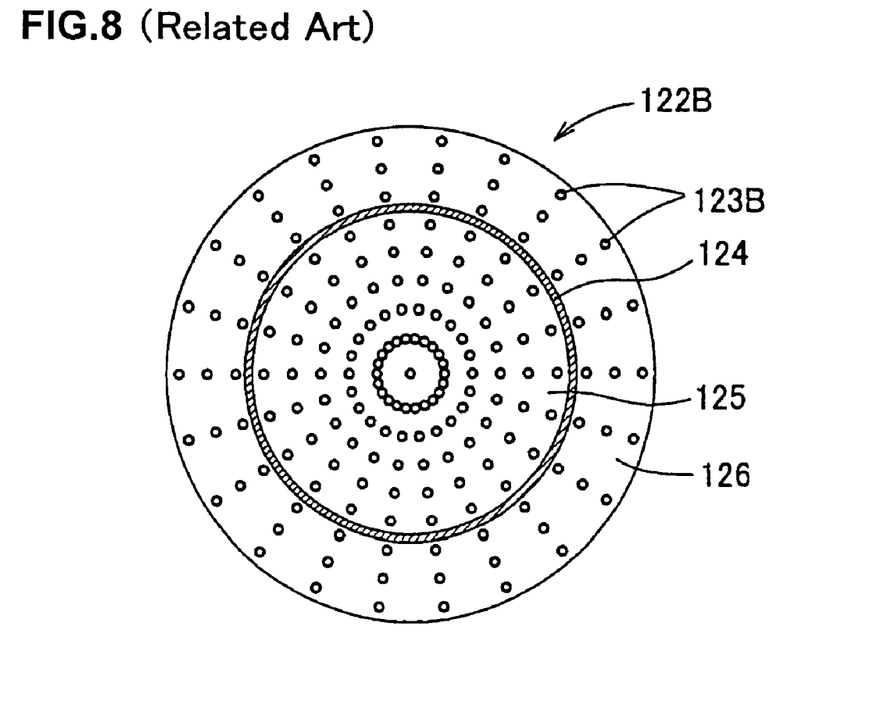
FIG. 8 is a plan view of another conventional shower plate.

A flow rate control system which supplies operation gas to a wafer controls a flow rate of operation gas which is to be supplied to a center area and an edge area of the wafer to uniformly supply the operation gas to the wafer. FIG. 6 is a schematic block diagram of a conventional flow rate control system 100. FIGS. 7 and 8 are plan views of conventional shower plates 122 (122A, 122B).

In a flow rate control system 100, flow rate control devices 101A, 101B, 101C and 101D are respectively connected to gas supply sources for gas such as $O_2$, Ar, $C_4F_8$ or CO. The flow rate control devices 101A to 101D include flow rate control valves 102A, 102B, 102C, 102D and flowmeters 103A, 103B, 103C, 103D, respectively, and adjust openings of the flow rate control valves 102A to 102D based on flow rates detected by the flowmeters 103A to 103D.

The flow rate control devices 101A to 101D are connected to a partial flow control device 110 through an operation gas supply pipe 104, and supply operation gas to an etching device 120. In the flow rate control device 110, flow rate control valves 111A and 111B are connected to the operation gas supply pipe 104 in parallel, and flowmeters 112A and 112B are the flow rate control valves 111A and 111B in series. The flow rate control valves 111A and 111B and the flowmeters 112A and 112B are connected to a controller 113. The controller 113 controls the flow rate control valves 111A and 111B based on flow rates detected by the flowmeters 112A and 112B. The flow rate control valves 111A and 111B of the partial flow control device 110 are respectively connected to a center shower 125 and an edge shower 126 of the shower plate 122 incorporated in the etching device 120.

The shower plate 122 is disposed above a lower electrode 121 which heats a wafer W. As shown in FIGS. 7 and 8, the shower plate 122 (122A, 122B) is provided with a large number of gas holes 123 in its surface opposed to the wafer W. A perfectly circular partition wall ring 124 is mounted on the shower plate 122 (122A, 122B), thereby dividing the shower plate 122 into a circular center shower 125 and an annular edge shower 126. In the shower plate 122A shown in FIG. 7, the gas holes 123A are arranged into a square shape, and they are arranged in a form of a square from a center to a periphery of the wafer W. In the shower plate 122B shown in FIG. 8, gas holes 123B are arranged concentrically, and are arrange concentrically from a center to a periphery of the wafer W.

Thus, in the flow rate control system 100, if a flow rate control valve 102B of a flow rate control device 101B is opened, Ar is branched into the flow rate control valves 111A and 111B of the partial flow control device 110 from the operation gas supply pipe 104, and supplied onto the wafer W from the center shower 125 and the edge shower 126. At that time, the partial flow control device 110 controls the opening and closing operation of the flow rate control valves 111A and 111B based on the flow rates detected by the flowmeters 112A and 112B, and Ar is injected at the predetermined flow rate using the center shower 125 and the edge shower 126. Therefore, Ar can uniformly be supplied to the entire wafer W (for example, paragraphs 0032, 0037, 0039 and FIGS. 1, 5, 7 and 8 of Japanese Patent Laid-open Publication No. 10-121253).

According to the conventional flow rate control system 100, however, responsivity with respect to the change of settings is inferior, and operation gas can not uniformly be supplied to the wafer W in some cases.

In generally, in the flow rate control system 100, the partial flow control device 110 is provided on the side of the etching device 120, and the gas supply source and the flow rate control devices 101A to 101D are provided on the side of a gas box away from the etching device 120. Thus, the wiring volume of the operation gas supply pipe 104 is great. The partial flow control device 110 controls the flow rate control valves 111A and 111B based on flow rates which are output from the flowmeters 112A and 112B and thus, it takes time to control them. Thus, in the flow rate control system 100, when the flow rate of operation gas is changed by the flow rate control devices 101A to 101D, it takes time until the flow rate of the operation gas flowing through the operation gas supply pipe 104 is stabilized, and since it takes time for the partial flow control device 110 to control, the responsivity of change of settings is inferior. On the other hand, the etching processing is carried out within a short time for preventing the chemical reaction of the operation gas. Thus, the flow rate control system 100 can not finish the control operation gas until the etching processing is completed, and can not uniformly supply the operation gas to the wafer W in some cases.

To enhance the responsivity, it seems better idea to control the pressure of the operation gas injected from the center shower 125 and the edge shower 126 using an absolute value instead of using the flow rate control device 110. However, such a system for controlling the pressure of the operation gas using the absolute value, it is necessary to provide a large tank on the primary sides of the flow rate control valves 111A and 111B and to store the operation gas using the pressure corresponding to the absolute value, and there is a problem that operation gas is squandered. In addition, according to the system for controlling the pressure of the operation gas using the absolute value, the responsivity with respect to the change of settings is inferior. For example, when it is necessary to change the pressure ratio of operation gas which is to be output from the flow rate control valves 111A and 111B, the pressure of operation gas to be stored in the large tank must be changed, and it takes time to control. When it is necessary to change the kind of operation gas, since the flow rate of the operation gas to be supplied from the operation gas supply pipe 104 to the partial flow control device 110 is varied depending upon the characteristics of the operation gas, it is difficult to swiftly determine the flow rate of operation gas which is to be output from the flow rate control valves 111A and 111B.

Figure 9:
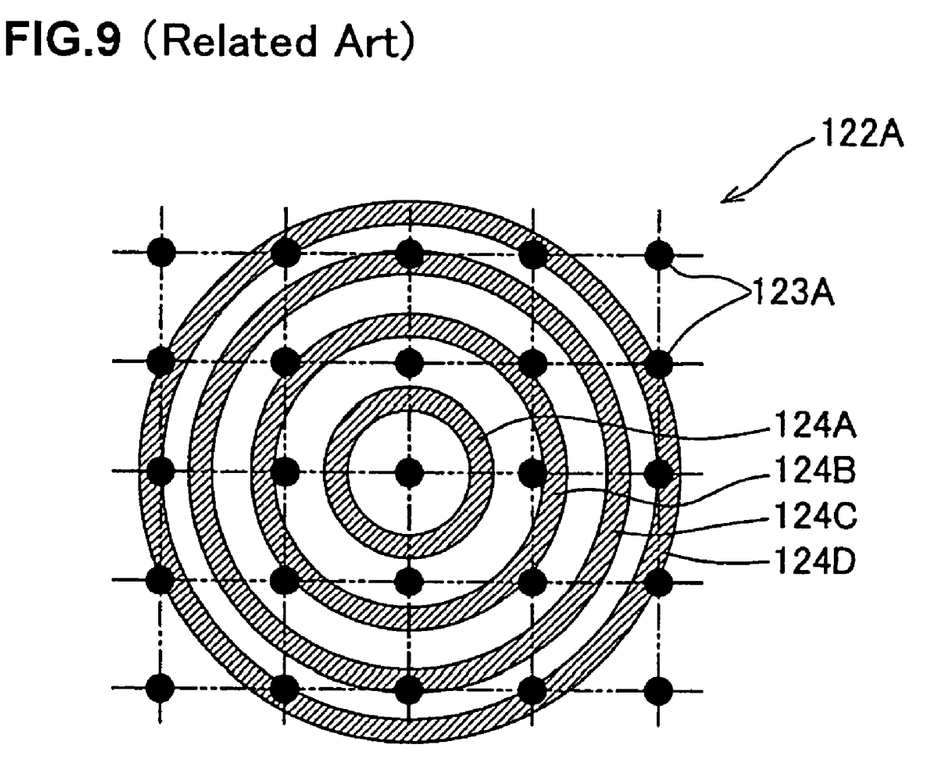
FIG. 9 shows an example of a disposition of a partition wall member in a shower plate in which gas holes are arranged in a form of square.

The layout of the gas holes 123 on the shower plate 122 also one of reasons why the operation gas can not be supplied to the wafer W uniformly. That is, when the gas holes 123A are arranged in the form of square as shown in FIG. 7, since distances between adjacent gas holes 123A are constant, the discharging density of the operation gas should be constant theoretically, but the probability that the gas holes 123A are crashed when the partition wall ring 124 is mounted is high. That is, as shown in FIG. 9, although the partition wall ring 124A does not crush the gas holes 123A, the partition wall rings 124B, 124C and 124D crush one or some of the gas holes 123A. If the gas holes 123A are crushed, the hole areas of the gas holes 123A are varied, and the discharging density of the operation gas can not be equalized. If the partition wall ring 124 is mounted such that the gas holes 123A are not crushed, the shape of the partition wall ring 124 is deformed, and it becomes difficult to mount the partition wall ring 124 on the shower plate 122A. If the gas hole 123B are arranged concentrically as shown in FIG. 8, it becomes easy to mount the partition wall ring 124 such that the gas hole 123B are not crushed. However, distances between the gas hole 123B on the shower plate 122B are varied, and there is a problem that the discharging density of the operation gas can not be equalized.

SUMMARY OF THE INVENTION

It is a first object of the present invention to provide a partial pressure control system capable of reduce wastefull consumption of operation gas, and capable of enhancing the responsivity with respect to the change of settings. It is a second object of the invention to provide a flow rate control system having excellent responsivity and capable of outputting operation gas at a precise partial pressure ratio. It is a third object of the invention to provide a shower plate used for the partial pressure control system capable of equalizing the discharging density of operation gas on a subject of supply.

To achieve the first object, the present invention provides a partial pressure control system comprising: a plurality of pressure control units which are branched from an operation gas supply pipe for controlling pressure of operation gas, variably; pressure detecting units which are connected the pressure control units in series for detecting the pressure of the operation gas; and a control unit which proportionally controls operation of the pressure control units based on detection result of the pressure detecting units and which relatively controls output pressures of the plurality of pressure control units.

The control unit may specify one of the pressure control units as a control subject, and the control unit may control only the specified pressure control unit, thereby keeping a pressure ratio.

The control unit may specify one of the pressure control units as the control unit based on a pressure ratio which is input to the partial pressure control system.

The number of the pressure control units may be two, the control unit may specify one of the two pressure control units as the control subject depending upon whether the pressure ratio which is input to the partial pressure control system is greater than 1 or not.

When the pressure ratio which is input to the partial pressure control system is obtained by dividing pressure in a first pressure control unit by pressure in a second pressure control unit, a target pressure of the first pressure control unit is expressed as a product of the pressure ratio and the pressure of the second pressure control unit, a target pressure of the second pressure control unit is expressed as a quotient obtained by dividing the pressure in the first pressure control unit by the pressure ratio, when the pressure ratio is smaller than 1, only the target pressure in the first pressure control unit is controlled, and when the pressure ratio is equal to or greater than 1, only the target pressure of the second pressure control unit is controlled.

The control unit may specify one of the pressure control units as the control subject based on the detection result of the pressure detecting unit.

The partial pressure control system may further comprise a zero point confirming unit, all of the pressure control units are fully opened, and when supply of the operation gas is stopped, the zero point confirming unit confirms whether pressure detected by the pressure detecting unit is within tolerance with respect to a zero point.

To achieve the second object, the present invention provides a flow rate control system comprising: a flow rate control device including a flow rate control valve connected to a gas supply source, and a flow rate detecting unit which detects a flow rate output by the flow rate control valve, the flow rate control device controlling the flow rate control valve based on a detection result of the flow rate detecting unit; an operation gas supply pipe connected to the flow rate control device; and a partial pressure control system including a plurality of pressure control units which are branched from the operation gas supply pipe and which control pressure of operation gas, variably, pressure detecting units which are respectively connected to the pressure control units in series and which detects pressure of the operation gas, and a control unit which proportionally controls operation of the pressure control unit based on detection result of the pressure detecting unit and which relatively controls output pressure of the pressure control units.

The flow rate control system may further comprise a zero point confirming unit, all of the pressure control units are fully opened, and when supply of the operation gas is stopped, the zero point confirming unit confirms whether pressure detected by the pressure detecting unit is within tolerance with respect to a zero point.

To achieve the third object, the present invention also provides a shower plate used for a partial pressure control system in which the shower plate is partitioned by a partition wall member and divided into a plurality of areas, the areas are connected to the partial pressure control system, and operation gas injected from each area to the supply subject is controlled. Adjacent gas holes for injecting the operation gas are arranged in a form of a regular triangle, and are arranged in a form of hexagon from a center to a periphery with respect to the supply subject.

DETAILED DESCRIPTION OF THE PREFERRED EMBODIMENTS

The action of the embodiments will be explained. Operation gas supplied from a gas supply source is supplied to an operation gas supply pipe simultaneously when a flow rate control valve of a flow rate control device is opened. At that time, the flow rate control device detects a flow rate which is output from the flow rate control valve by means of the flow rate detecting unit, the flow rate control valve is controlled based on the detection result, thereby supplying the operation gas at the predetermined flow rate to the operation gas supply pipe.

The operation gas is output such that the operation gas is branched into pressure control units of the partial pressure control system from the operation gas supply pipe. The partial pressure control system detects the output pressure of the pressure control unit by means of a pressure detecting unit, and proportionally controls the pressure control unit based on the detection result of the pressure detecting unit. Since the pressure control unit of the partial pressure control system is connected to the operation gas supply pipe in a branched manner, if one of pressure control unit is proportionally controlled to vary the output pressure, output pressure of the other pressure control unit is also varied relatively. Thus, the partial pressure control system can output the operation gas from the pressure control unit at the predetermined partial pressure ratio irrespective of a flow rate of operation gas supplied from the operation gas supply pipe.

Even if the flow rate control system is disposed in such a manner that the flow rate control device and the partial pressure control system are separated away from each other and a piping volume of the operation gas supply pipe becomes large and the setting of the flow rate of the operation gas is changed by the flow rate control device, the partial pressure control system proportionally controls the pressure control unit based on the pressure detected by the pressure detecting unit and outputs operation gas at the predetermined partial pressure ratio irrespective of the flow rate of the operation gas supplied from the operation gas supply pipe. Therefore, the controlling time is shortened.

According to the flow rate control system of the present invention, the responsivity with respect to change of settings is excellent, and operation gas can be output at a precise partial pressure ratio.

Since the partial pressure control system controls operation gas under relative pressure based on pressure which is output from the pressure control unit, it is unnecessary to provide a large tank on the primary side of the pressure control unit to store the operation gas unlike a case where the operation gas is controlled under absolute pressure. To change the pressure ratio of operation gas which is output from each pressure control unit, it is only necessary for the partial pressure control system to control the pressure control unit. Also when the kinds of operation gas is to be changed, since the partial pressure control system controls the operation gas under the absolute pressure, it is possible to swiftly determine the pressure ratio of the operation gas which is output from each pressure control unit irrespective of kinds of operation gas. Therefore, according to the partial pressure control system, it is possible to reduce the wastefull consumption of operation gas, and to enhance the responsivity with respect to the change of settings.

When operation gas is to be controlled in a partial pressure manner, if one of the pressure control units having the least output pressure is specified as a subject to be controlled, the plurality of pressure control units can be controlled in a diversion manner.

The partial pressure control system and the flow rate control system include a zero point confirming unit, and confirm whether the control state is constant or not.

When the supply of operation gas is stopped in a state in which all of the pressure control units are fully opened, operation gas remaining in the operation gas supply pipe passes through the pressure control unit and flows downstream and at the same time, the pressure to be detected by each pressure detecting unit is also reduced toward the zero point. The zero point confirming unit confirms the zero point position based on the reduction of the pressure. With this, the flow rate control system and the partial pressure control system can swiftly find a trouble of the system.

Next, the action of the shower plate used for the partial pressure control system will be explained.

In the shower plate used for the partial pressure control system, areas divided by the partition wall member are connected to the partial pressure control system, and pressures of operation gases which are output the respective areas are controlled. Since the gas holes from which the operation gases are injected are arranged in the form of triangle in the shower plate, the distances between the adjacent gas holes are substantially constant. Since the gas holes are arranged in a form of hexagon from a center toward a periphery with respect to the supply subject, when the shower plate is divided by a perfectly circular partition wall member for example, the gas holes are less prone to be crushed. Therefore, the probability of crush of the gas holes by the partition wall member is lowered, and the discharging density of the operation gas can be uniform on the supply subject.

Figure 2:
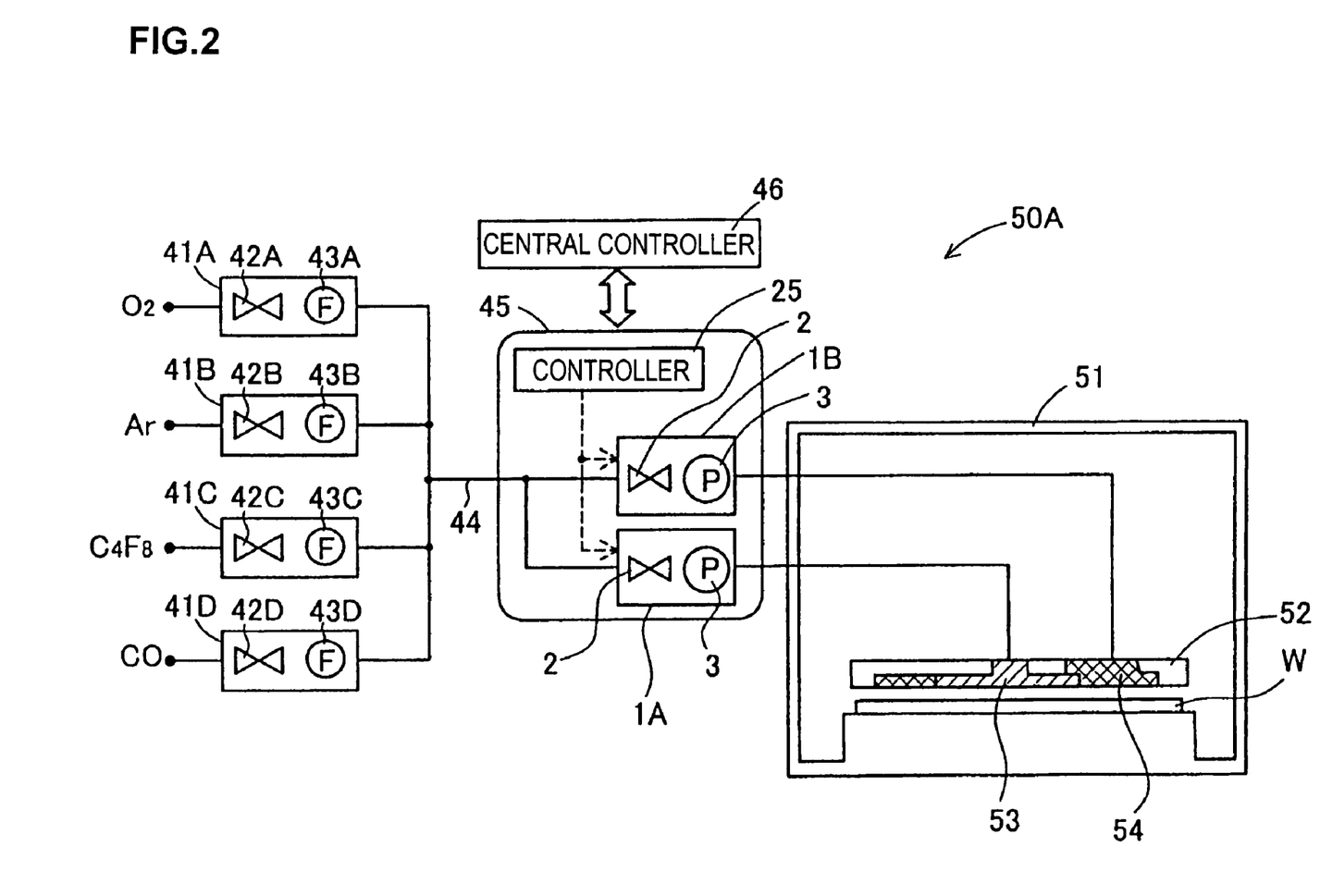
FIG. 2 is a schematic block diagram of a flow rate control system according to the first embodiment of the invention.

Next, the first embodiment of the shower plate used for the partial pressure control system, the flow rate control system and the partial pressure control system of the present invention will be explained with reference to the drawings. FIG. 2 is a schematic block diagram of a flow rate control system 50A.

The flow rate control system 50A in FIG. 2 is used for etching processing of a semiconductor producing apparatus. The flow rate control system 50A has a gas supply source for gas such as $O_2$, Ar, $C_4F_8$ or CO, and a plurality of flow rate control devices 41A, 41B, 41C and 41D connected to the gas supply source. The flow rate control devices 41A to 41D includes flow rate control valves 42A, 42B, 42C and 42D and flowmeters (corresponding to "flow rate detecting unit") 43A, 43B, 43C and 43D, and adjust the openings of the flow rate control valves 42A to 42D based on flow rates detected by the flowmeters 43A to 43D.

The operation gases supplied from the flow rate control devices 41A to 41D are injected from a shower plate 52 of a chamber 51 through an operation gas supply pipe 44 and a partial pressure control system 45. At that time, in order to supply the operation gas to the center shower 53 and the edge shower 54 of the shower plate 52 at a predetermined partial pressure ratio, the partial pressure control system 45 controls the operation gas.

The partial pressure control system 45 includes a pressure control device 1A connected to the center shower 53, and a pressure control device 1B connected to the edge shower 54. The pressure control devices 1A and 1B includes a pressure control valve (corresponding to "pressure control units", and if one of them is defined as a first pressure control unit, the other one can be defined as a second pressure control unit) 2, and a pressure sensor (corresponding to "pressure detecting unit") 3, and they are respectively connected to controllers (corresponding to "control device" of the partial pressure control system 45) 25 so that one of outputs is adjusted based on the detection result of the pressure sensor 3. A central controller (including ones corresponding to "control device" of the flow rate control system 50A) 46 for controlling the operation of the entire semiconductor producing apparatus is connected to the controller 25. The central controller 46 always monitors the flow rate control state of the operation gas.

Figure 1:
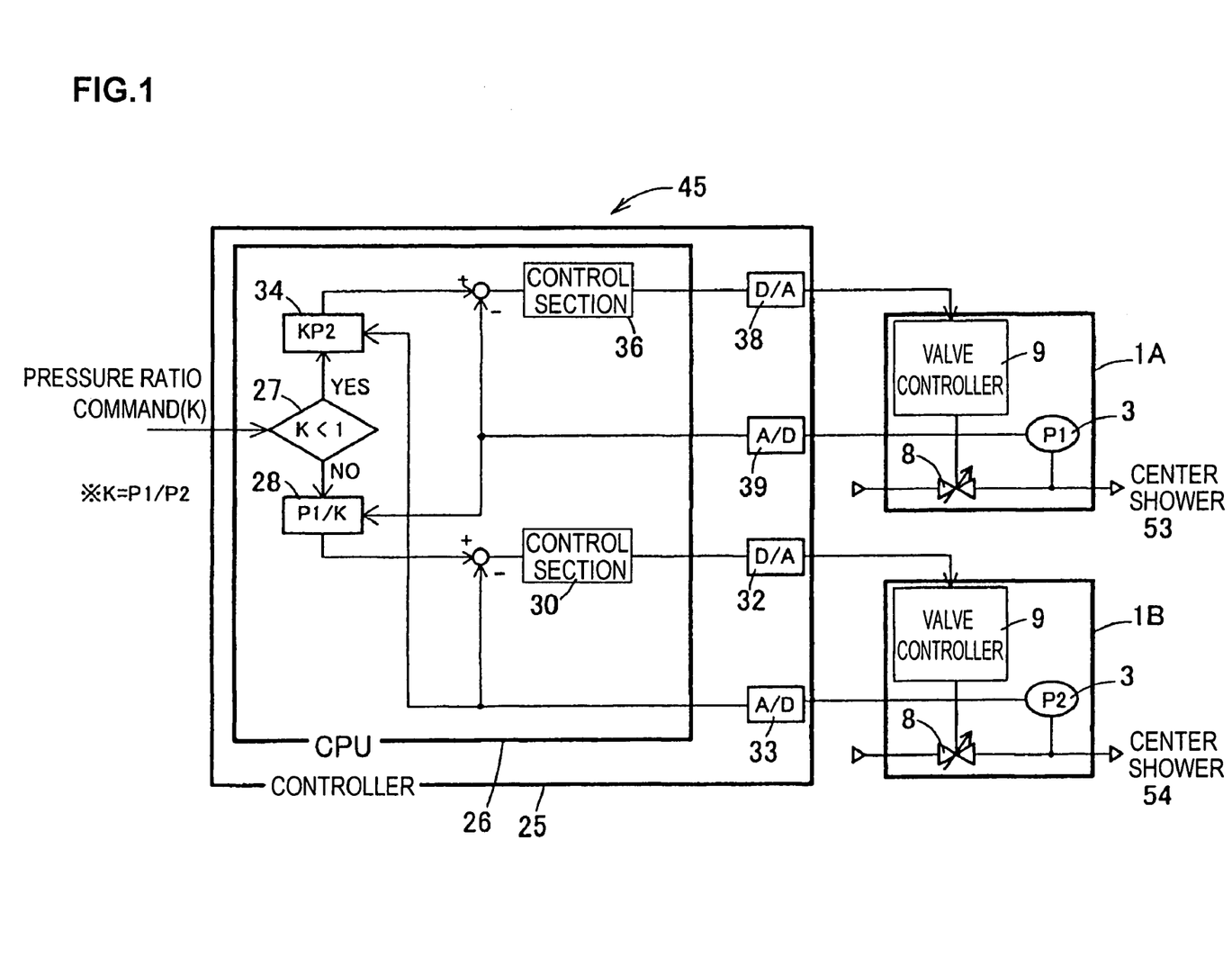
FIG. 1 is a block diagram of a partial pressure control system according to a first embodiment of the present invention.

FIG. 1 is a block diagram of the partial pressure control system 45.

The controller 25 of the partial pressure control system 45 are connected to valve controllers 9 incorporated in the pressure control devices 1A and 1B, and adjusts the openings of the normally-opened valves 8. With this adjustment, pressures of operation gases which are output by the pressure control units comprising the valve controllers 9 and the valves 8 are controlled. A piezo-valve or the like may be used as the valve 8.

The controller 25 includes a Central Processing Unit (it is called a CPU in the following description) 26, fully opens one of the valves 8 having higher output pressure, specifies the other valve 8 having lower output pressure as a control subject, and controls the pressure ratio. The CPU 26 includes a control subject determining section 27 which determines a control subject in accordance with pressure ratio command K (here, K=target pressure P1/target pressure P2) which is input to a device operation screen of the central controller 46. Connected to the control subject determining section 27 in parallel are a calculating section 28 which calculates the target pressure P2 (=P1/K) of the pressure control device 1B based on the pressure ratio command K, and a calculating section 34 which calculates the target pressure P1 (=K×P2) of the pressure control device 1A based on the pressure ratio command K.

A control section 30 is connected to the calculating section 28. The control section 30 determines a control signal based on a deviation between the pressure P2 which is fed back from the pressure sensor 3 of the pressure control device 1B and the target pressure P2 (=P1/K) of the pressure control device 1B which is input from the calculating section 28. The control section 30 is connected to the valve controller 9 of the pressure control device 1B through a D/A converter 32. The pressure sensor 3 of the pressure control device 1B is connected to the calculating section 34 through an A/D converter 33, and is feedback connected to an upstream of the control section 30.

A control section 36 is connected to the calculating section 34. The control section 36 determines a control signal based on a deviation between a pressure P1 which is fed back from the pressure sensor 3 of the pressure control device 1A and the target pressure P1 (=KP2) of the pressure control device 1A which is input from the calculating section 34. The control section 36 is connected to the valve controller 9 of the pressure control device 1A through the D/A converter 38. The pressure sensor 3 of the pressure control device 1A is connected to the calculating section 28 through the A/D converter 39, and is feedback connected to the upstream of the control section 36.

The partial pressure control system 45 is operated as follows.

That is, in the flow rate control system 50A shown in FIG. 2, when the flow rate control valves 42A to 42D of the flow rate control devices 41A to 41D are closed and no operation gas is supplied, a cut-signal is input to the CPU 26 of the controller 25 as shown in FIG. 1. The CPU 26 receives the cut-signal, and stops the operation of the valve controllers 9 of the pressure control devices 1A and 1B through the D/A converters 32 and 38. Therefore, no control signal is supplied to the valves 8 of the pressure control devices 1A and 1B, and the valves 8 are fully (normally) opened.

Next, a case where Ar is supplied to the wafer W in the flow rate control system 50A shown in FIG. 2 will be explained. A pressure ratio command K is input to the flow rate control system 50A from the device operation screen of the central controller 46. When the process is transferred, the flow rate control system 50A controls Ar in accordance with a parameter in a recipe setting screen.

If the flow rate control valve 42B of the flow rate control device 41B is opened, Ar supplied from the gas supply source is supplied to the operation gas supply pipe 44 simultaneously. At that time, the flow rate control device 41B detects the flow rate of the Ar which is output from the flow rate control device 41B by the flowmeter 43B, and controls the flow rate control device 41B based on the detection result, thereby supplying Ar to the operation gas supply pipe 44 at the predetermined flow rate.

The Ar is supplied to the wafer W from the shower plate 52 through the operation gas supply pipe 44 and the partial pressure control system 45. That is, in the partial pressure control system 45, since the valves 8 of the pressure control devices 1A and 1B are fully opened, pressures of the Ar passing through the pressure sensors 3 of the pressure control devices 1A and 1B are increased to substantially the same level, the Ar is branched from the operation gas supply pipe 44 into the valves 8 of the pressure control devices 1A and 1B, and is supplied to the wafer W through the center shower 53 and the edge shower 54 of the shower plate 52.

At that time, the pressure sensor 3 of the pressure control device 1A detects the pressure P1 of the Ar which is output from the valve 8, and outputs a detection signal to the calculating section 28 of the CPU 26 through the A/D converter 39, and the detection signal is fed back to the control section 36.

The pressure sensor 3 of the pressure control device 1B detects the pressure P2 of the Ar which is output from the valve 8, outputs a detection signal to the calculating section 34 of the CPU 26 through the A/D converter 33, and the detection signal is fed back to the control section 30.

The CPU 26 receives an arbitrary pressure ratio command K (here, K=target pressure P1/target pressure P2), and judges whether the pressure ratio command K is smaller than 1. If the pressure ratio command K is smaller than 1, i.e., the target pressure P2 of the pressure control device 1B is greater than the target pressure P1 of the pressure control device 1A, the CPU 26 judges that the valve 8 of the pressure control device 1A is the control subject, and immediately starts controlling the valve 8 of the pressure control device 1A. At that time, since the valve 8 of the pressure control device 1B is fully opened, the pressure P2 of the pressure control device 1B is increased. The CPU 26 monitors the pressure P2 of the pressure control device 1B and controls the valve 8 of the pressure control device 1A such that the pressure ratio becomes equal to the instruction value. That is, the control section 36 of the CPU 26 determines the control signal with respect to the valve 8 of the pressure control device 1A such that the pressure P1 of the pressure control device 1A and the pressure P2 of the pressure control device 1B become equal to the partial pressure ratio based on the deviation between the target pressure P1 (=KP2) of the pressure control device 1A and the pressure P1 which is fed back from the pressure sensor 3 of the pressure control device 1A. In accordance with this control, in the pressure control device 1A, the valve controller 9 adjusts the opening of the valve 8. Thus, the Ar is output to the wafer W at the predetermined partial pressure ratio from the center shower 53 and the edge shower 54 and is supplied to the entire wafer W uniformly.

If the pressure ratio command K is not smaller than 1, i.e., the pressure P1 of the pressure control device 1A is equal to or greater than the pressure P2 of the pressure control device 1B, the valve 8 of the pressure control device 1B is controlled in the same manner as that described above so that the pressure P2 of the pressure control device 1B is allowed to instantaneously reach the target value. Thus, the Ar can be supplied to the center area and the edge area of the wafer W at the predetermined partial pressure ratio. In this case, a value (P1/K) obtained by dividing the pressure P1 detected by the pressure sensor 3 of the pressure control device 1A by the pressure ratio command K is used as the target pressure P2 of the pressure control device 1B in the calculating section 28.

Next, a case in which the flow rate control system 50A changes the flow rate of operation gas will be explained. In general, in the flow rate control system 50A, the gas supply source and the flow rate control device 41 are provided on the side of a gas box located away from the chamber 51, and the partial pressure control system 45 is provided on the side of the chamber 51. Therefore, the piping volume of the operation gas supply pipe 44 becomes large in size. In such a flow rate control system 50A, when the opening of the flow rate control valve 42B of the flow rate control device 41B is changed and the flow rate of operation gas to be supplied to the operation gas supply pipe 44 is changed, the partial pressure control system 45 proportionally controls the valves 8 of the pressure control devices 1A and 1B based on the pressures P1 and P2 detected by the pressure sensors 3 of the pressure control devices 1A and 1B irrespective of the flow rate of Ar supplied from the operation gas supply pipe 44, and outputs the Ar at the predetermined partial pressure ratio. Therefore, the control time is shortened. Thus, the responsivity of the flow rate control system 50A with respect to the change of settings is excellent, and it is possible to output the operation gas at a precise partial pressure ratio.

In the partial pressure control system 45, since the Ar is controlled under the relative pressure based on the pressures P1 and P2 which are output by the valves 8 of the pressure control devices 1A and 1B, it is unnecessary to provide large tanks on the primary sides of the valves 8 of the pressure control devices 1A and 1B to store the Ar unlike a case in which the operation gas is controlled under the absolute pressure. In the partial pressure control system 45, when the pressure ratio of Ar which is output from the valves 8 of the pressure control devices 1A and 1B, it is only necessary to control smaller one of the pressures P1 and P2 of the valves 8 of the pressure control devices 1A and 1B.

Next, a case in which the flow rate control system 50A changes the kinds of operation gas will be explained.

When the flow rate control system 50A changes the kinds of operation gas (e.g., from Ar to CO in this embodiment), the flow rate control valve 42B of the flow rate control device 41B is closed, and the energization to the valve controllers 9 of the pressure control devices 1A and 1B is stopped, and the valves 8 is fully opened. With this operation, Ar remaining downstream of the flow rate control devices 41A to 41D is discharged into the chamber 51 from the pressure control devices 1A and 1B. Then, the flow rate control valve 42D of the flow rate control device 41D is opened to supply CO to the partial pressure control system 45 from the operation gas supply pipe 44, and the CO is injected from the center shower 53 and the edge shower 54 of the shower plate 52 at the predetermined partial pressure ratio.

In the partial pressure control system 45, the pressure sensors 3 detect pressures P1 and P2 of CO which are output from the valves 8 of the pressure control devices 1A and 1B, and the CO is controlled under the relative pressure based on the detection results. Therefore, even if the characteristics such as compression ratio of the CO and Ar are different from each other, the partial pressure control system 45 can swiftly determines the pressure ratio of CO which is to be output from the valves 8 of the pressure control devices 1A and 1B.

Thus, according to the flow rate control system 50A of the embodiment, the flow rate control system of this embodiment comprises the flow rate control devices 41A to 41D which control the flow rate control valves 42A to 42D based on the detection results of the flowmeters 43A to 43D. The flow rate control devices 41A to 41D include the flow rate control valves 42A to 42D connected to the gas supply source, and the flowmeters 43A to 43D which detect the flow rates which are output from the flow rate control valves 42A to 42D. The flow rate control system 50A also comprises the operation gas supply pipe 44 connected to the flow rate control devices 41A to 41D, and the partial pressure control system 45 includes the two valves 8 which are branched from the operation gas supply pipe 44 and which variably control the operation gas, the pressure sensors 3 which are respectively connected to the valves 8 in series for detecting the pressures P1 and P2 of the operation gas, and the controller 25 which proportionally controls the operation of the valves 8 based on the detection result of the pressure sensors 3 to relatively control the pressures P1 and P2 which are output from the two valves 8. Therefore, the responsivity with respect to the change of setting is excellent, and it is possible to output the operation gas at a precise partial pressure ratio.

The partial pressure control system 45 of this embodiment comprises the two valves 8 which are branched from the operation gas supply pipe 44 and which variably control the operation gas, the pressure sensors 3 which are connected to the valves 8 in series and which detect the pressures P1 and P2 of the operation gases, and the controller 25 which proportionally controls the operations of the valves 8 based on the detection results of the pressure sensors 3 to relatively control the pressures P1 and P2 of the two valves 8. Therefore, it is possible to reduce the wastefull consumption of operation gas, and to enhance the responsivity with respect to the change of settings.

In the partial pressure control system 45 of this embodiment, the controller 25 specifies, as the control subject, smaller one of the pressures P1 and P2 of the valves 8 of the pressure control devices 1A and 1B, and controls the action of the control subject based on the detection result of the pressure sensor 3. Therefore, it is possible to control the valves 8 of the pressure control devices 1A and 1B in a diversion manner.

At that time, when the partial pressure control system 45 controls the pressure P1 to be output from the pressure control device 1A, the partial pressure control system 45 calculates the target pressure P1 (=K×P2) of the pressure control device 1A from the pressure P2 detected by the pressure control device 1B and the pressure ratio command K, and controls the opening and closing operation of the valve 8 of the pressure control device 1A. On the other hand, when the partial pressure control system 45 controls the pressure P2 to be output from the pressure control device 1B, the partial pressure control system 45 calculates the target pressure P2 (=P1/K) of the pressure control device 1B from the pressure P1 detected by the pressure control device 1A and the pressure ratio command K, and controls the opening and closing operation of the valve 8 of the pressure control device 1B. Thus, it is possible to shorten the control time of the valves 8, and to enhance the processing ability of the entire system.

The partial pressure control system 45 and the flow rate control system 50A, which control the partial pressure include a zero point confirming unit in the controller 25, and confirm whether the control state is constant. When the control of the partial pressure of operation gas is to be stopped or when the kinds of operation gas are to be changed, the zero point confirming unit is allowed to operate to detect the abnormality of the partial pressure control system 45.

Figure 3:
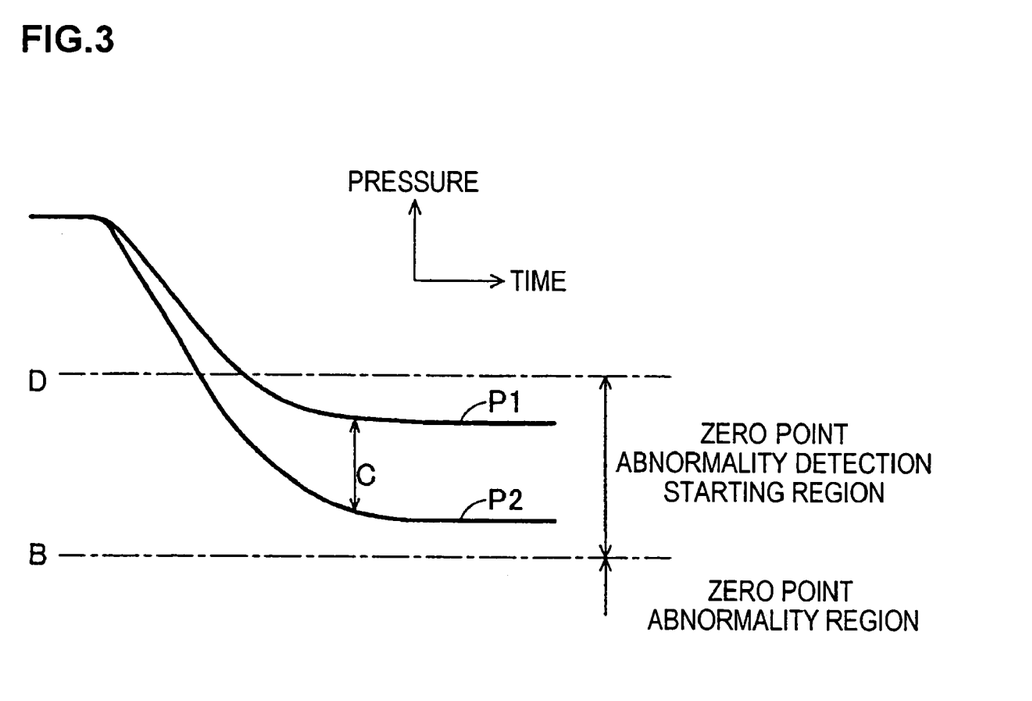
FIG. 3 shows one example of zero point confirmation according to the first embodiment, wherein a vertical axis shows pressure and a lateral axis shows time.

The zero point confirming unit may be operated when the flow rate control devices 41A to 41D are to be closed. As shown in FIG. 3, the zero point confirming unit close the flow rate control devices 41A to 41D to stop the supply of operation gas, and when the pressures P1 and P2 detected by the pressure sensor 3 become equal to or smaller than predetermined threshold value D, the zero point confirming unit confirms a zero point shift based on the pressure reduction of the pressure sensor 3.

More specifically, if the control of the valves 8 by the valve controllers 9 of the pressure control devices 1A and 1B is stopped and the flow rate control devices 41A to 41D are closed, operation gas remaining downstream of the flow rate control devices 41A to 41D is supplied into the chamber 51 from the valves 8 of the pressure control devices 1A and 1B. With this, the pressures P1 and P2 detected by the pressure sensors 3 are reduced toward the zero point.

When one of the pressures P1 and P2 of the valves 8 becomes equal to or lower than the predetermined threshold value D, pressures P1 and P2 of the valves 8 are detected at constant intervals (e.g., 500 ms msec intervals) by the pressure sensor 3, and it is judged whether the detected pressures P1 and P2 are within tolerance. For example, the pressure difference (P1−P2) between the pressures P1 and P2 is calculated, and it is judged whether the pressure difference is within tolerance C (within 0.1 kPa) with respect to the zero point, and whither each of the pressures P1 and P2 of the valves 8 is smaller than a predetermined threshold value B (e.g., −0.15 kPa). There, the tolerance C is a deviation amount of the zero point position which can not functionally be permitted, and the threshold value B is a value which should not be shown by the pressure sensor 3 under a normal condition.

If it is judged that the pressure P1 and P2 difference is not within tolerance C, or when it is judged that any one of the output pressures P1 and P2 is smaller than the predetermined threshold value B, it is judged that the output pressures P1 and P2 are not within tolerance C. In this case, the pressure which should be indicated under a normal condition is not indicated, abnormality is detected. If the detection of abnormality is continuously counted several times (three times in this embodiment), an alarm is given to inform an operator of the abnormality of the partial pressure control system 45. The reason why it is necessary to count the detection of abnormality several times is to prevent an erroneous detection. With this, the flow rate control system 50A and the partial pressure control system 45 can swiftly find a system trouble.

Figure 4:
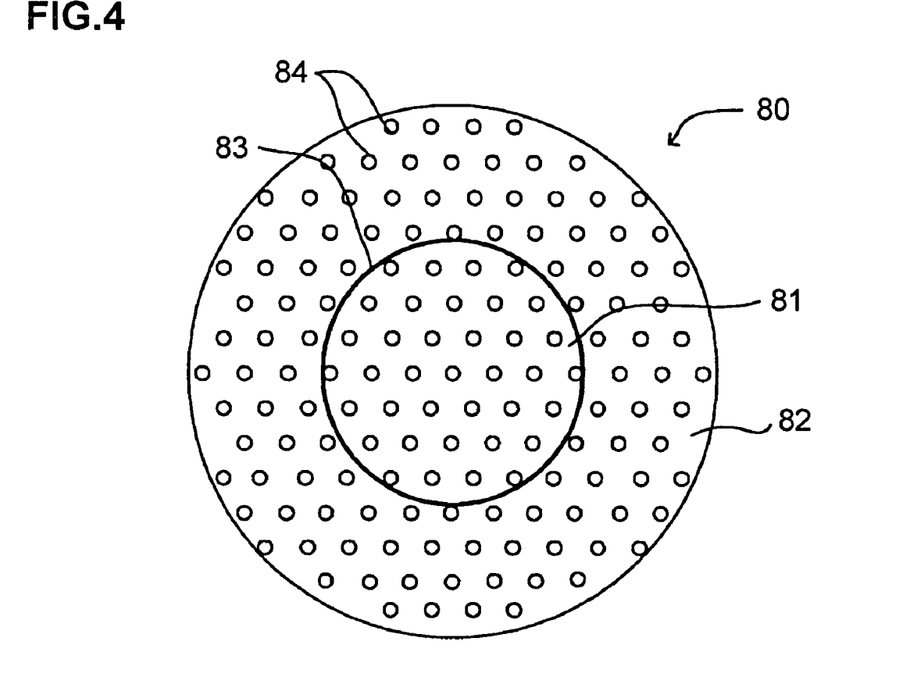
FIG. 4 is a plan view of a shower plate according to a second embodiment of the invention.
Figure 5:
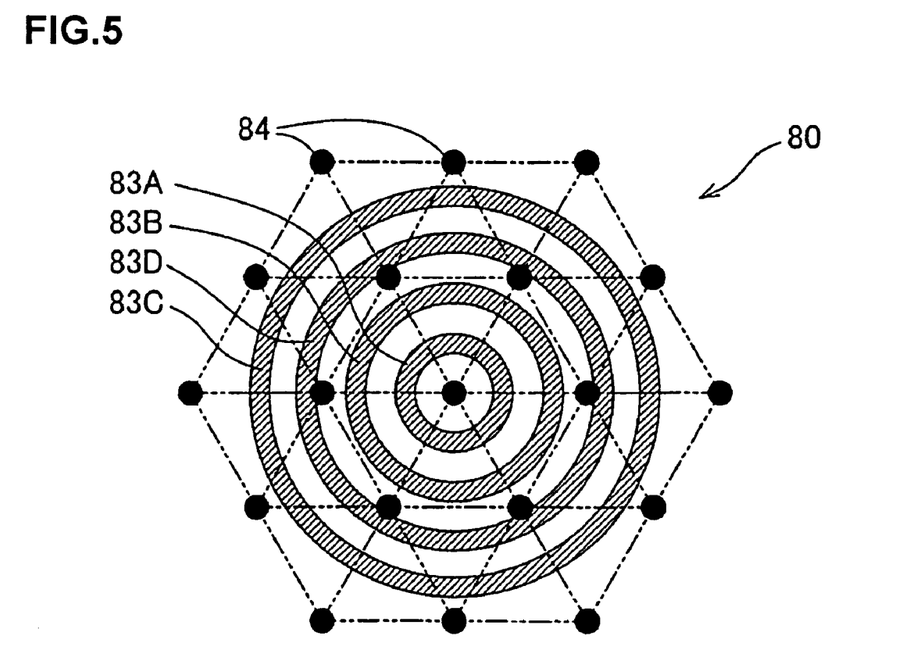
FIG. 5 shows an example of a disposition of a partition wall member according to the second embodiment of the invention.

A second embodiment of the shower plate used for the partial pressure control system, the flow rate control system and the partial pressure control system will be explained. FIG. 4 is a plan view of a shower plate 80. FIG. 5 shows an example of layout of a partition wall ring 83.

The shower plate 80 shown in FIG. 4 is provided in the chamber 51 like the shower plate 52 of the first embodiment, and is used for supplying operation gas to the center area and the edge area of the wafer (corresponding to "supply subject") W at a predetermined partial pressure ratio. The shower plate 80 is of a disk-like shape, and the shower plate 80 is divided into a disk-like center shower 81 and an annular edge shower 82 by mounting a perfectly circular partition wall ring (corresponding to "partition wall member") 83 on the shower plate 80. A plurality of gas holes 84 injecting the operation gas are formed in a surface of the shower plate 80 opposed to the wafer W. The adjacent gas holes 84 are arranged in a form of regular triangle, and are arranged in a form of hexagon from center to periphery with respect to the wafer W.

The shower plate 80 supplies operation gas which is controlled by the partial pressure control system to the wafer W from the gas holes 84 of the center shower 81 and the edge shower 82. Since the gas holes 84 of the shower plate 80 are arranged in the form of regular triangle, distances between the adjacent gas holes 84 are constant. Since the gas holes 84 are arranged in the form of hexagon from center to periphery with respect to the wafer W, the gas holes 84 are not prone to be crushed when the shower plate 80 is divided by the partition wall ring 83. That is, when the partition wall ring 83 is mounted as shown in FIG. 5, although the partition wall ring 83D crushes the gas holes 84, the partition wall rings 83A, 83B and 83C do not crush the gas holes 84. Thus, the probability that the gas holes 84 are crushed in the case of the shower plate 80 when the perfectly circular partition wall ring 83 is mounted is remarkably low as compared with the shower plate 122A (see FIG. 9) in which the gas holes 123A are arranged in a form of square. It is easy to mount the partition wall rings 83.

The shower plate 80 used for the partial pressure control system of this embodiment is concentrically partitioned by the partition wall ring 83 and divided into a plurality of areas, and the pressure of operation gas supplied to the wafer W from each area is controlled by the partial pressure control system, the adjacent gas holes 84 injecting the operation gas are arranged in the form of regular triangle, and are arranged in the form of hexagon from the center to the periphery with respect to the wafer W. Thus, the probability that the gas holes 84 are crushed by the partition wall ring 83, and the discharging density of operation gas can be equalized on the wafer W.

Although the embodiments of the present invention have been explained above, the invention is not limited to the embodiments, and various applications can be made.

(1) For example, in the above embodiment, the pressure of operation gas which is output from the two valves 8 is adjusted to the pressure ratio command K. Alternatively, the partial pressure of operation gas which is output from three or more valves 8 may be adjusted.

(2) For example, valves 8 are controlled such that the valves 8 are fully opened when the control is started, one of the valves 8 having greater output pressure is left opened and the other valve 8 having smaller output pressure is specified as the control subject in the first embodiment. Alternatively, the valves 8 may be fully closed when the control is started, and the valves 8 of the pressure control devices 1A and 1B may be controlled.

(3) For example, the partial pressure control system 45 is used for the flow rate control system 50A which is used for a semiconductor producing apparatus in the first embodiment. However, if the purpose is to output operation gas at a predetermined partial pressure ratio, the subject to which the invention is applied is not limited to the semiconductor producing apparatus.

Effect of the Invention will be Explained

The partial pressure control system of the present invention includes a plurality of pressure control units which are branched from an operation gas supply pipe and which variably control pressure of operation gas, pressure detecting units which are respectively connected to the pressure control units in series and which detect pressure of operation gas, and a control unit which proportionally controls operation of the pressure control unit based on a detection result of the pressure detecting unit, thereby relatively controlling the pressures of the pressure control units. Therefore, it is possible to reduce wastefull consumption of the operation gas, and to enhance the responsivity with respect to change of setting and the like.

The flow rate control system of the present invention comprises, a flow rate control device including a flow rate control valve connected to a gas supply source, and a flow rate detecting unit which detects a flow rate output by the flow rate control valve, the flow rate control device controlling the flow rate control valve based on a detection result of the flow rate detecting unit, an operation gas supply pipe connected to the flow rate control device, and a partial pressure control system including a plurality of pressure control units which are branched from the operation gas supply pipe and which variably control pressure of operation gas, pressure detecting units which are respectively connected to the pressure control units in series and which detects pressure of the operation gas, and a control unit which proportionally controls operation of the pressure control unit based on detection result of the pressure detecting unit and which relatively controls output pressure of the pressure control units. Therefore, the responsivity with respect to the change of settings and the like is excellent, and it is possible to output operation gas at a precise partial pressure ratio.

In the shower plate of the present invention used for a partial pressure control system, the shower plate is partitioned by a partition wall member and divided into a plurality of areas, the areas are connected to the partial pressure control system, and operation gas injected from each area to the supply subject is controlled. Adjacent gas holes for injecting the operation gas are arranged in a form of a regular triangle, and are arranged in a form of hexagon from a center to a periphery with respect to the supply subject. Therefore, the probability that the gas holes are crushed by the partition wall member can be lower, and discharging density of the operation gas can be equalized on the supply subject.

What is claimed is:

1. A partial pressure control system comprising:
a plurality of pressure control units which are branched from an operation gas supply pipe for controlling pressure of operation gas;
a plurality of pressure detecting units which are respectively connected to each of the pressure control units in series for detecting the pressure of the operation gas; and
a control unit configured to proportionally control operation of the pressure control units based on the pressures detected by the pressure detecting units and further configured to relatively control output pressures of the plurality of pressure control units.

2. The partial pressure control system according to claim 1, wherein the control unit is further configured to specify one of the pressure control units as a control subject, and to control only the specified pressure control unit, thereby keeping a pressure ratio.

3. The partial pressure control system according to claim 2, wherein the control unit is further configured to specify one of the pressure control units as the control subject based on a pressure ratio inputted to the partial pressure control system.

4. The partial pressure control system according to claim 3, wherein the number of pressure control units is two, and wherein the control unit is further configured to specify one of the two pressure control units as the control subject depending upon whether the pressure ratio is greater than 1 or not.

5. The partial pressure control system according to claim 4, wherein
when the pressure ratio is obtained by dividing pressure in a first pressure control unit by pressure in a second pressure control unit, a target pressure of the first pressure control unit is expressed as a product of the pressure ratio and the pressure of the second pressure control unit, and a target pressure of the second pressure control unit is expressed as a quotient obtained by dividing the pressure in the first pressure control unit by the pressure ratio,
when the pressure ratio is smaller than 1, only the target pressure in the first pressure control unit is controlled, and
when the pressure ratio is equal to or greater than 1, only the target pressure of the second pressure control unit is controlled.

6. The partial pressure control system according to claim 2, wherein the control unit is further configured to specify one of the pressure control units as the control subject based on the pressures detected by the pressure detecting units.

7. The partial pressure control system according to claim 1, further comprising a zero point confirming unit configured to confirm, when all of the pressure control units are fully opened and when supply of the operation gas is stopped, whether the pressures detected by the pressure detecting units are within tolerance with respect to a zero point.

* * * * *